(12) United States Patent
van der Muehlen et al.

(10) Patent No.: US 6,489,626 B2
(45) Date of Patent: *Dec. 3, 2002

(54) WAFER ORIENTATION SENSOR FOR GAAS WAFERS

(75) Inventors: Hajo van der Muehlen, Kirchseon (DE); Peter Bruno Mouttet, Olching (DE); Bernhard Boche, Munich (DE)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 09/916,984

(22) Filed: Jul. 27, 2001

(65) Prior Publication Data

US 2001/0042845 A1 Nov. 22, 2001

Related U.S. Application Data

(63) Continuation of application No. 09/547,133, filed on Apr. 7, 2000.

(51) Int. Cl.[7] .................................................. G01V 8/00
(52) U.S. Cl. ........................ 250/559.29; 250/559.33
(58) Field of Search ......................... 250/559.3, 559.33, 250/559.36, 559.37, 559.4, 559.44, 548, 559.29; 414/754

(56) References Cited

U.S. PATENT DOCUMENTS

| | | |
|---|---|---|
| 4,345,836 A | 8/1982 | Phillips |
| 4,836,733 A | 6/1989 | Hertel et al. |
| 4,887,904 A | 12/1989 | Nakazato et al. |
| 5,102,280 A | 4/1992 | Poduje et al. |
| 5,125,791 A * | 6/1992 | Volovich ................ 414/786 |
| 5,126,569 A * | 6/1992 | Carlson ................ 250/341 |
| 5,238,354 A | 8/1993 | Volovich |
| 5,264,918 A | 11/1993 | Kagami |
| 5,365,672 A | 11/1994 | Kato |
| 5,405,230 A | 4/1995 | Ono et al. |
| 5,452,078 A | 9/1995 | Cheng |
| 5,513,948 A | 5/1996 | Bacchi et al. |
| 5,563,798 A | 10/1996 | Berken et al. |
| 5,684,599 A | 11/1997 | Shimoyama et al. |
| 5,740,034 A | 4/1998 | Saeki |
| 6,038,029 A | 3/2000 | Finarov |
| 6,134,011 A | 10/2000 | Klein et al. |
| 6,162,008 A | 12/2000 | Perkins et al. |
| 6,256,094 B1 | 7/2001 | Eyolfson et al. |
| 6,274,878 B1 | 8/2001 | Li et al. |

FOREIGN PATENT DOCUMENTS

| | | |
|---|---|---|
| EP | 0 734 054 A1 | 9/1996 |
| EP | 0 913 236 A2 | 5/1999 |
| GB | 2 157 078 A | 10/1985 |
| JP | 62-243339 | 10/1987 |
| JP | 1-202835 | 8/1989 |
| JP | 01 303737 A | 12/1989 |
| JP | 10 242250 A | 12/1998 |

OTHER PUBLICATIONS

E. Hecht, "Optics", Addison–Wesley Pub. Co., 1987, pp. 99–108.
Warren J. Smith, "Modern Optical Engineering" McGraw–Hill Book Co., 1966, pp. 77–78.

\* cited by examiner

*Primary Examiner*—Robert H. Kim
*Assistant Examiner*—Hoon K. Song
(74) *Attorney, Agent, or Firm*—Wolf, Greenfield & Sacks, P.C.

(57) ABSTRACT

A wafer oriented includes a mechanism for rotating a wafer and a wafer orientation sensor. The wafer orientation sensor includes a light source for emitting light, a light sensor for sensing the light emitted by the light source as an edge of the wafer is rotated between the light source and the sensor and for producing a sensor signal representative of the sensed light, and an optical filter positioned between the light source and the light sensor. The optical filter has a light-transmission characteristic wherein light in the pass band of the wafer is blocked. When the wafer orientation sensor is used for sensing gallium arsenide wafers, the optical filter is selected to block light at wavelengths greater than about 860 nanometers.

14 Claims, 5 Drawing Sheets

WAFER ORIENTATION SENSOR FOR GAAS WAFERS

FIELD OF THE INVENTION

This invention relates to orientation sensors for disk-shaped workpieces, such as semiconductor wafers, and, more particularly, to wafer orientation sensors for sensing the orientation of gallium arsenide wafers.

BACKGROUND OF THE INVENTION

Ion implantation has become a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded in the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam is distributed over the target area by beam scanning, by target movement or by a combination of beam scanning and target movement. In one conventional approach, an ion beam is directed as a semiconductor wafer and is scanned in one direction. The wafer is translated perpendicular to the scanning direction to distribute the ion beam over the wafer. In another approach, multiple semiconductor wafers are mounted near the periphery of a disk. The disk is rotated about its central axis and is translated with respect to the ion beam to distribute the ion beam over the semiconductor wafers. A variety of different ion implanter architectures are known to those skilled in the art. The ion implanter typically includes an end station having automated wafer handling equipment for introducing wafers into the ion implanter and for removing wafers after implantation.

The wafer handling system typically transfers wafers from a cassette or other wafer holder to a process station, such as a wafer mounting site. One requirement of the wafer handling system is to accurately position the wafer at the process station with its flat or notch having a predetermined angular orientation. The slots in the wafer holder are somewhat larger than the wafer and thus does not ensure accurate wafer positioning. Furthermore, the wafer flat or notch orientation is not controlled in the wafer holder. However, accurate positioning at the process station is necessary to ensure reliable wafer retention and to avoid wafer damage. In addition, ion implantation systems typically require a particular angular orientation of the wafer flat or notch, which is indicative of the crystal orientation of the wafer, to control channeling by implanted ions.

A wafer transfer system incorporating a wafer orienter is disclosed in U.S. Pat. No. 4,836,733, issued Jun. 6, 1989 to Hertel et al. A wafer is placed on an orienter chuck and is rotated. An orientation sensor includes a light source positioned below the edge of the wafer and a solar cell positioned above the edge of the wafer in alignment with the light source. The light beam from the source is directed perpendicular to the wafer surface. The wafer blocks a portion of the light beam from reaching the solar cell. As the wafer is rotated, the proportion of the light beam reaching the solar cell varies when the wafer is displaced from the center of rotation and when a fiducial, such as a flat or a notch, passes the solar cell. The signal output from the solar cell is therefore indicative of wafer offset and of the fiducial. Based on the signal from the orientation sensor, offset and angular orientation may be corrected. Wafer aligners are also disclosed in U.S. Pat. Nos. 5,452,521, issued Sep. 26, 1996 to Niewmierzycki; 5,238,354, issued Aug. 24, 1993 to Volovich; and 4,345,836, issued Aug. 24, 1982 to Phillips.

Prior art wafer orientation sensors provide generally satisfactory results with conventional silicon wafers. However, in some instances, the ion implanter is required to operate with wafers of different materials, such as gallium arsenide wafers. It has been determined that the conventional optical orientation sensor is unable to reliably sense the orientation of a gallium arsenide wafer.

Accordingly, there is a need for improved wafer orientation sensors which can sense the orientation of wafers having different properties, including gallium arsenide wafers.

SUMMARY OF THE INVENTION

Accordingly to a first aspect of the invention, a wafer orienter for a wafer having a light-transmission characteristic including a pass band and a stop band is provided. The wafer orienter comprises a mechanism for rotating the wafer and a wafer orientation sensor. The wafer orientation sensor includes a light source for emitting light, a light sensor for sensing the light emitted by the light source as an edge of the wafer is rotated between the light source and the sensor and for producing a sensor signal representative of the sensed light, and an optical filter positioned between the light source and the light sensor. The optical filter has a light-transmission characteristic wherein light in the pass band of the wafer is blocked.

In a preferred embodiment, the wafer is a gallium arsenide wafer and the optical filter blocks light in the pass band of the gallium arsenide wafer. Preferably, the optical filter blocks light at wavelengths greater than about 860 nanometers. The light source may comprise an incandescent lamp which emits light that includes wavelengths in the pass band of the gallium arsenide wafer.

According to another aspect of the invention, a method is provided for sensing orientation of a wafer having a light-transmission characteristic including a pass band and a stop band. The method comprises the steps of rotating the wafer, directing light emitted by a light source toward an edge of the wafer as the wafer is rotated, sensing the light emitted by the light source with a light sensor as the edge of the wafer is rotated between the light source and the light sensor, and blocking light in the pass band of the wafer from reaching the light sensor.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
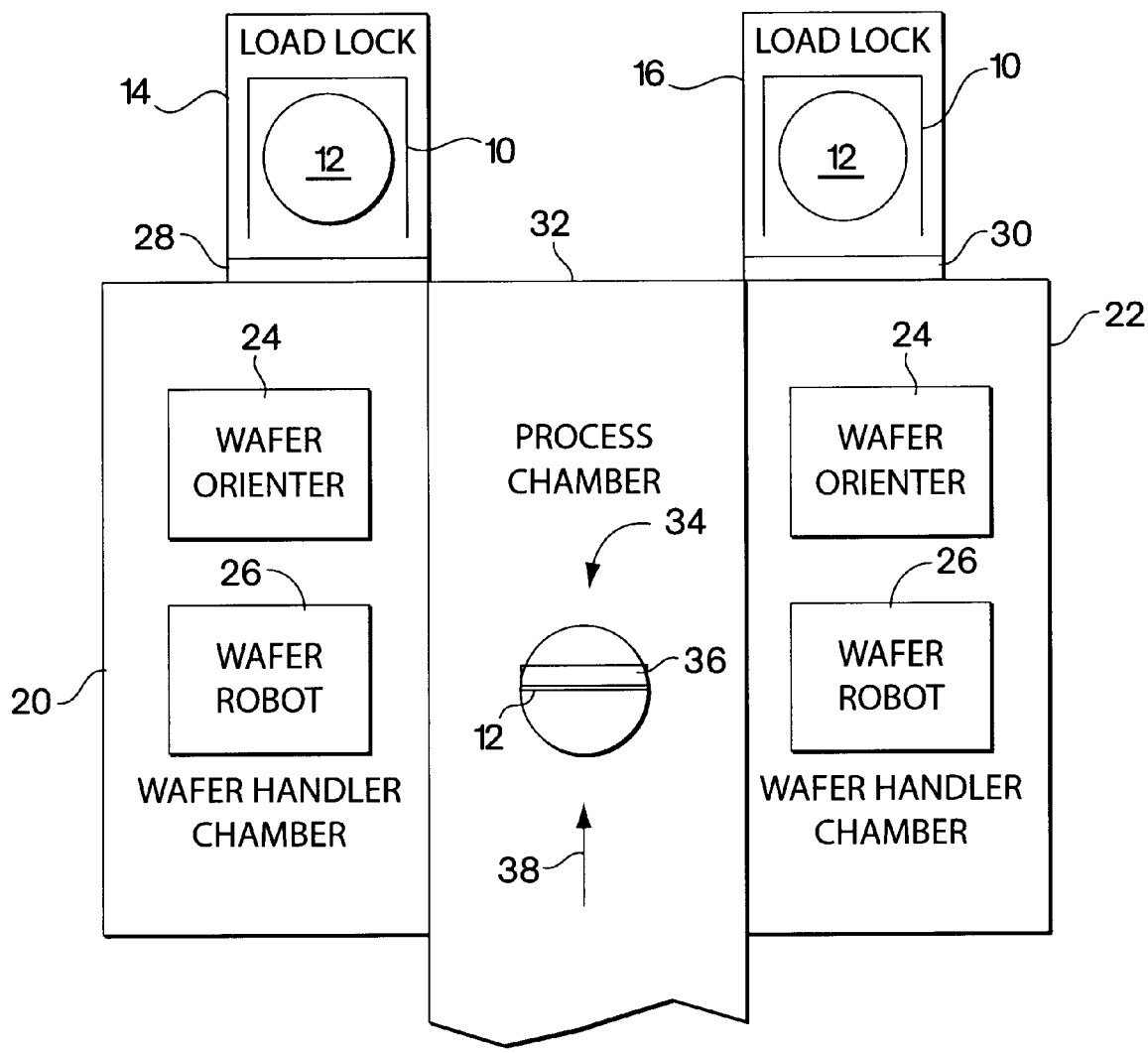
FIG. 1 is a top schematic view of an example of a prior art wafer transfer apparatus suitable for incorporation of the invention.

An example of a wafer transfer apparatus suitable for incorporation of the present invention is shown schematically in FIG. 1. The wafer transfer apparatus may be part of an end station for an ion implanter or can be utilized for transferring wafers to a process station in any type of processing or treatment system. Cassette holders 10, each holding a plurality of wafers 12, are placed in load locks 14 and 16. A first wafer handler chamber 20 and a second wafer hander chamber 22 each contain a wafer orienter 24 and a wafer robot 26. Chamber 20 may be isolated from load lock 14 by a gate valve 28, and chamber 22 may be isolated from load lock 16 by a gate valve 30. A process chamber 32 contains a process station 34, such as a platen 36 for holding wafer 12 during implantation with an ion beam 38.

In operation, load lock 14 is evacuated and gate valve 28 is opened. Wafers are removed from cassette holder 10 in load lock 14 one at a time by wafer robot 26 and are moved to wafer orienter 24. The load locks 14 and 16 include elevators for indexing cassette holders 10 relative to the respective wafer robots 26. The wafer offset and angular orientation are sensed at wafer orienter 24 by a wafer orientation sensor. The wafer robot 26 then transfers the wafer from wafer orienter 24 to process station 34 in process chamber 32. In placing the wafer at process station 34, offset errors sensed at wafer orienter 24 may be eliminated by compensating displacements. At process station 34, the wafer is rotated from a horizontal orientation into a vertical or other desired orientation for processing.

After processing, wafer robot 26 returns the wafer to the cassette holder 10 in load lock 14. Whether or not the wafer is oriented by wafer orienter 24 during the return of the wafer from process station 34 to cassette holder 10 is user selectable. The wafer orienter 24 and wafer robot 26 in wafer handler chamber 22 may operate in the same manner as the corresponding elements in wafer handler chamber 20, as described above. In an alternative operating mode, wafers may be transferred to process station 34 for processing through wafer handler chamber 20 and may be removed from process station 34 following processing through wafer handler chamber 22, or vice versa. The configuration with two wafer handler chambers 20 and 22 provides the capability to perform wafer handling and orientation of one wafer simultaneously with processing of another wafer.

Figure 2:
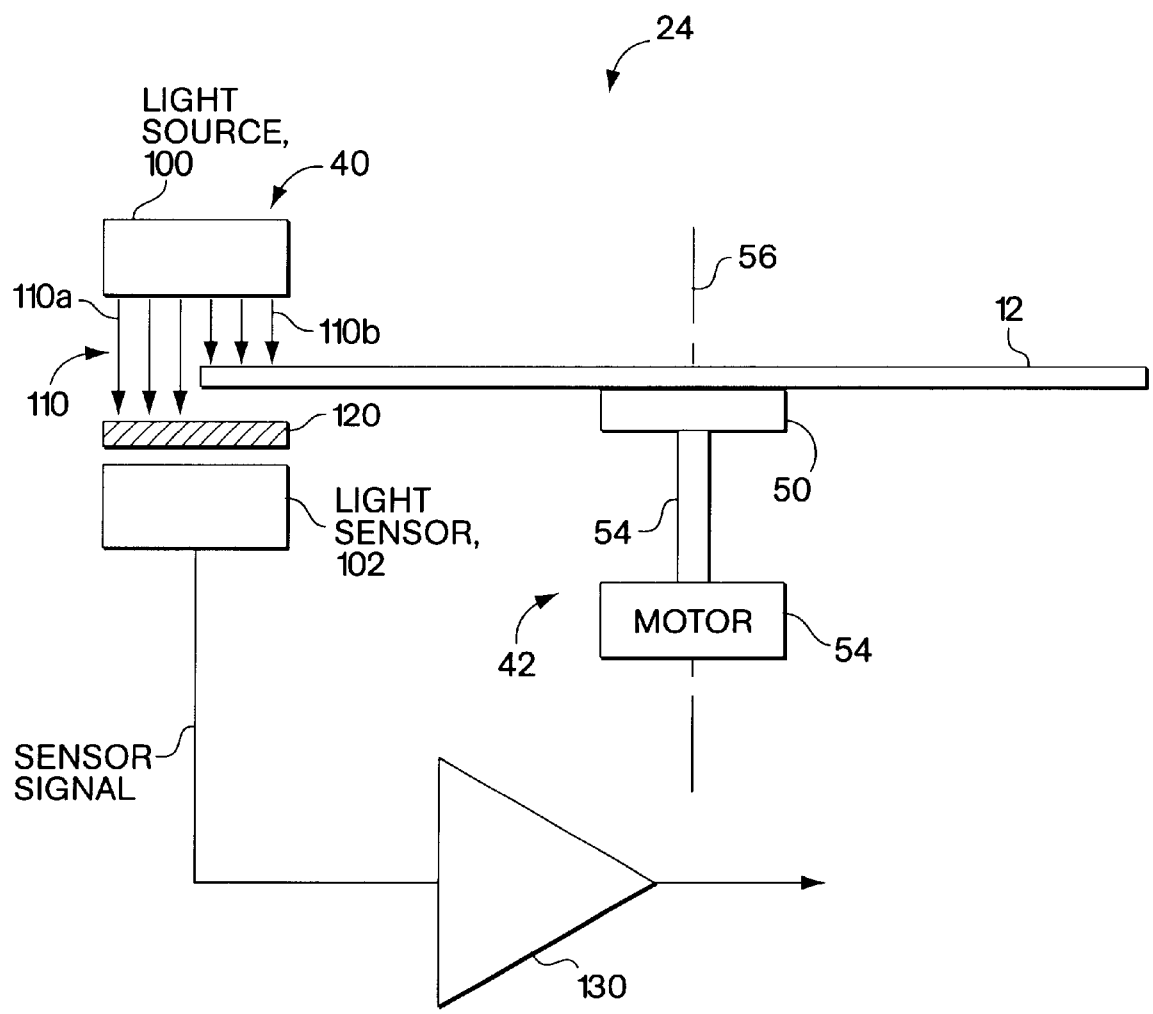
FIG. 2 is a schematic side view of a wafer orientation sensor in accordance with an embodiment of the invention.
Figure 3:
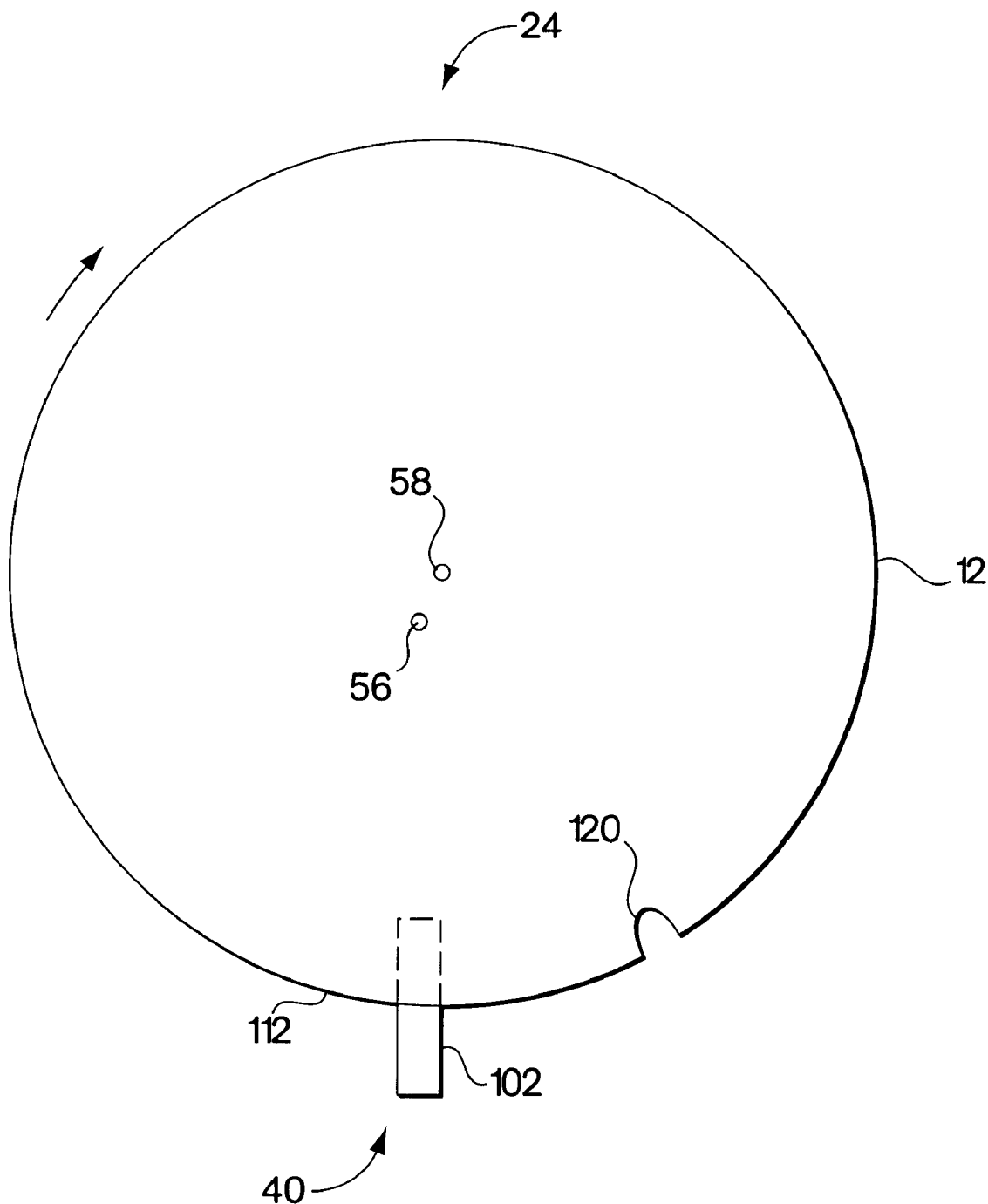
FIG. 3 is a schematic top view of the wafer orientation sensor of FIG. 2.

Schematic side and top views of wafer orienter 24 are shown in FIGS. 2 and 3, respectively. The basic components of wafer orienter 24 include a wafer orientation sensor 40 and a mechanism 42 for supporting and rotating wafer 12. Mechanism 42 includes an orienter chuck 50 connected by a shaft 52 to a motor 54. Orienter chuck 50 supports wafer 12 in a horizontal orientation. When motor 54 is energized, orienter chuck 50 and wafer 12 are rotated about an axis 56. As shown in FIG. 3, axis of rotation 56 may be displaced from the center 58 of wafer 12 in cases where the wafer 12 is not perfectly centered on orienter chuck 50. Mechanism 42 for rotating wafer 12 is used during wafer orientation sensing to rotate wafer 12 with respect to wafer orientation sensor 42 and is used to correct angular orientation following wafer orientation sensing. Wafer offset may be corrected by applying corrections to the movement of wafer robot 26 (FIG. 1).

Wafer orientation sensor 40 includes a light source 100, a light sensor 102 and an optical filter 120. Light source 100 produces an light beam 110 which may be collimated. Light beam 110 may be directed at an edge 112 of wafer 12 perpendicular to the surface of wafer 12. Light source 100 is positioned such that a first part 110a of light beam 110 passes wafer edge 112 and a second part 110b of the light beam 110 is intercepted by wafer 12. The position of wafer edge 112 changes a wafer 12 is rotated due to a fiducial notch or flat on the wafer and due to offset of wafer center 58 relative to axis of rotation 56. Accordingly, light beam 110 should have sufficient width so that it is partially blocked by wafer edge 112 over the range of expected positions of edge 112. If light beam 110 is totally blocked by wafer 12 or is not incident on wafer 12, the orientation center sensor is unable to sense wafer edge 112.

Light sensor 102 is positioned below wafer 12 and in alignment with light beam 110. The first part 110a of light beam 110 that passes wafer 12 is incident on sensor 102, whereas the second part 110b of light beam 110 that is intercepted by wafer 12 is not incident on sensor 102. As shown in FIG. 3, sensor 102 may have a rectangular sensing area, with the long dimensions of the rectangular sensing area oriented radially with respect to axis of rotation 56. Light sensor 102 produces a sensor signal that varies as the proportion of its sensing area receiving light beam 110 increases or decreases.

The sensor signal, which is representative of wafer offset and angular orientation, may be provided through an amplifier 130 to a position controller (not shown) that controls wafer position and orientation. For example, a position controller may control motor 54 and wafer robot 26.

Figure 4:
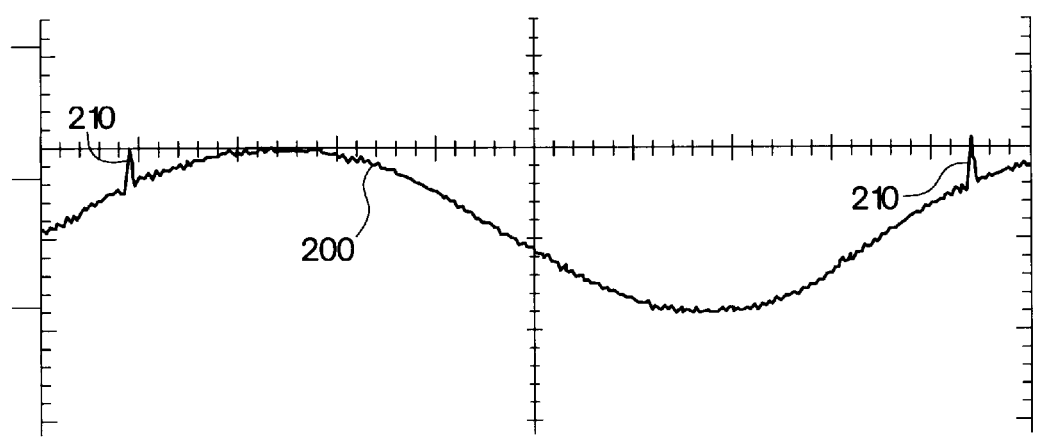
FIG. 4 is a graph of the sensor signal as a function of time for a notched wafer.

A graph of sensor signal from the wafer orientation sensor 40 as a function of time is shown in FIG. 4. The sensor signal varies with time as the wafer is rotated about axis 56 (FIG. 2). A waveform 200 represents the sensor signal from a notched wafer. The roughly sinusoidal shape of waveform 200 is indicative of the offset of the wafer center 58 with respect to the axis of rotation 56. By analyzing the amplitude of waveform 200 as a function, of angle with respect to the axis of rotation 56, the X and Y components of offset with respect to axis of rotation 56 can be determined. Fiducial notch 120 (FIG. 3) is visible in waveform 200 as a spike 210, which indicates the angular orientation of wafer 12. Waveform 200 may be correlated to rotation of wafer 12 about axis of rotation 56 by using a shaft encoder mounted to the output shaft 52 of motor 54.

Referring again to FIG. 2, wafer orientation sensor 40 includes optical filter 120 positioned between light source 100 and light sensor 102. The orientation sensor 40 operates satisfactorily for sensing the orientation of silicon wafers in the absence of optical filter 120. However, it has been discovered that the wafer orientation sensor 40 does not operate satisfactorily for sensing the orientation of gallium arsenide wafers in the absence of optical filter 120.

Figure 5:
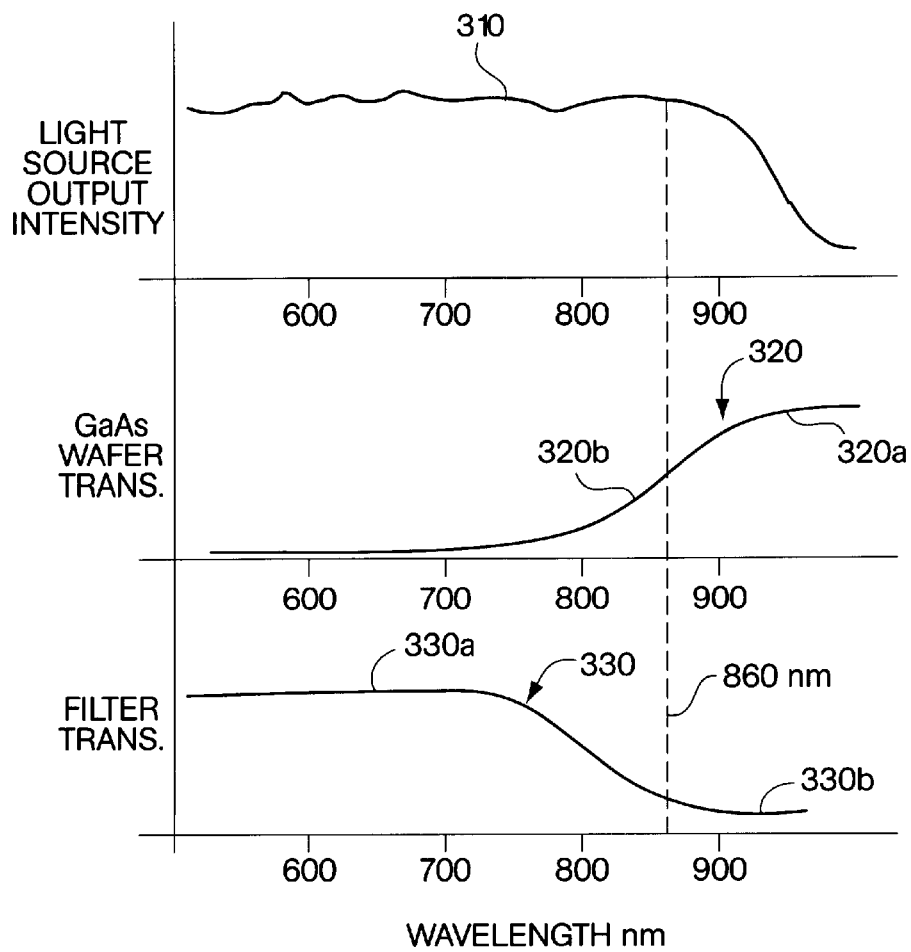
FIG. 5 is a graph of light source relative output intensity, gallium arsenide wafer light transmission and optical filter light transmission as a function of wavelength in nanometers.

The light source 100 in the wafer orientation sensor 40 of FIG. 2 is typically an incandescent lamp. Referring to FIG. 5, an incandescent lamp typically has a broad output intensity spectrum, as represented by curve 310. Curve 310 represents the relative intensity of light source 100 as a function of wavelength in nanometers. Curve 320 in FIG. 5 represents a typical light-transmission characteristic of a gallium arsenide wafer as a function of wavelength. It may be observed that the gallium arsenide wafer is characterized by relative low light transmission at wavelengths below about 860 nanometers and relatively high light transmission at wavelengths above about 860 nanometers. Thus, light-transmission characteristic 320 of the gallium arsenide wafer includes a pass band 320a at wavelengths above about 860 nanometers and a stop band 320b at wavelengths less than about 860 nanometers. It will be understood that the transition between pass band 320a and stop band 120b may be relatively gradual or relatively abrupt as a function of wavelength, depending on the characteristics of the material.

A comparison of light source spectrum 310 and gallium arsenide light-transmission characteristic 320 indicates the reason for malfunctioning of orientation sensor 40 with gallium arsenide wafers in the absence of optical filter 120. In particular, it may be seen that the portion of light source 100 output within pass band 320a of a gallium arsenide wafer (wavelengths greater than about 860 nanometers) is transmitted through the wafer to light sensor 102. Since light from source 100 is transmitted through wafer 12, the sensor is unable, to distinguish between the presence and absence of wafer 12 and therefore cannot sense wafer edge 112. By contrast, silicon wafers do not have a pass band within the spectrum 310 of light source 100, and light beam 110 is not transmitted through silicon wafers.

As shown in FIG. 5, optical filter 120 is selected to have a transmission characteristic 330 including a pass band 330a within the stop band 320b of the gallium arsenide wafer and a stop band 330b in the pass band 320a of the gallium arsenide wafer. This ensures that light emitted by source 100 in the stop band 320b of the gallium arsenide wafer reaches light sensor 102 when the gallium arsenide wafer is not blocking the light. By contrast, light emitted by light source 100 within the pass band 320a of the gallium arsenide wafer is blocked by optical filter 120 from reaching light sensor 102. In the example of the gallium arsenide wafer, optical filter 120 preferably has a light-transmission characteristic that cuts off at about 860 nanometers. That is, the filter transmits at wavelengths less than about 860 nanometers and blocks light at wavelengths greater than about 860 nanometers. Therefore, the light sensed by light sensor 102 does not include light transmitted through wafer 12, and the sensor signal is representative of the position of wafer edge 112. Referring again to FIG. 2, the gain of amplifier 130 may be adjusted to compensate for loss of sensor signal resulting from light attenuation in optical filter 120.

Figure 6:
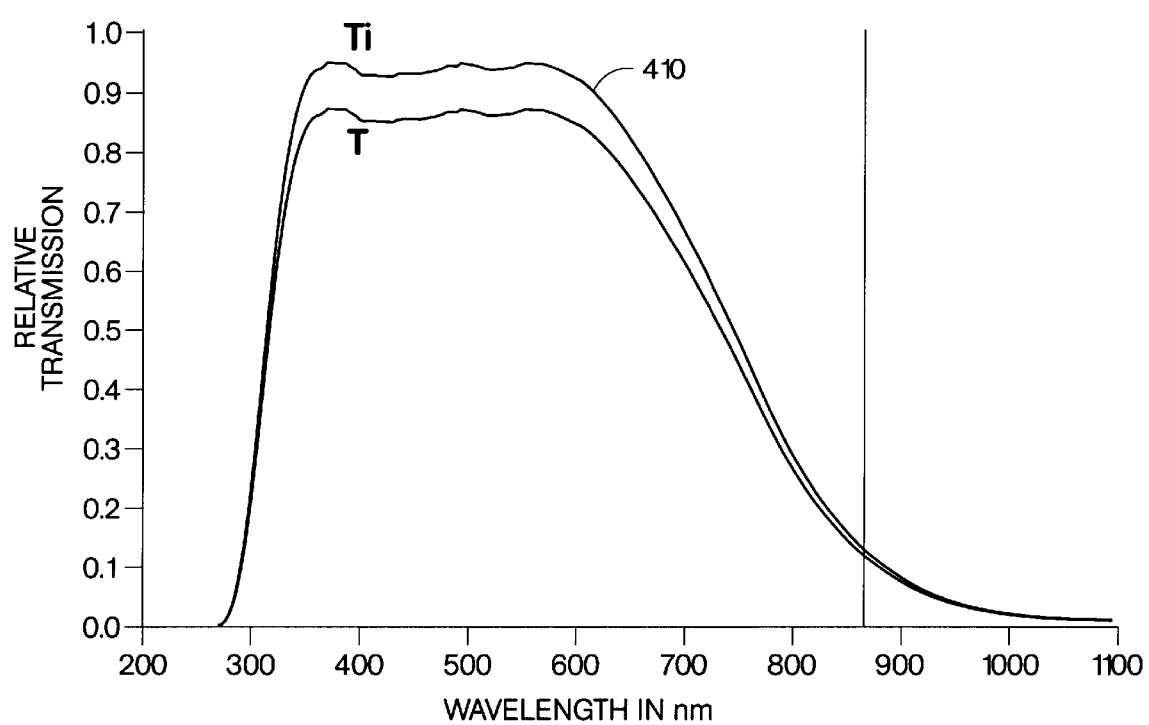
FIG. 6 is a graph of relative light transmission as a function of wavelength in nanometers, illustrating an example of a suitable optical filter characteristic.

An example of a suitable optical filter transmission characteristic for sensing gallium arsenide wafers is represented by curve 410 in FIG. 6. In one implementation which provided satisfactory results, optical filter 120 was a Schott Model KG 1 having characteristic DIN 58191.

The invention has been described for the case of a gallium arsenide wafer. More generally, the transmission characteristic of optical filter 120 is selected to block light in the pass band of the wafer and to transmit light outside the pass band of the wafer, but within the emission spectrum of the light source. This ensures that the wafer orientation sensor 40 can reliably sense wafer edge 112. Thus, different optical filter transmission characteristics may be utilized for different wafer materials and different light sources.

The optical filer 120 is shown in FIG. 2 as positioned between wafer 12 and light sensor 102. As an alternative, optical filter 120 may be positioned between light source 100 and wafer 12. In general, optical filter 120 may be positioned between light source 100 and light sensor 102. However, optical filter 120 should be positioned to avoid excessive heating by light source 100. Furthermore, the positions of light source 100 and light sensor 102 may be reversed, such that light source 100 is below wafer 12 and light sensor 102 is above wafer 12. In addition, light beam 110 may be directed at wafer edge 112 at an angle different from 90°, either from above or below, with appropriate adjustment of the positions of light source 100 and light sensor 102 to sense wafer edge 112.

The wafer orienter of the invention has been described in connection with the wafer transfer apparatus of FIG. 1. It will be understood that the wafer orienter may be utilized independently or in any wafer transfer or handling apparatus that requires a wafer orienter.

While there have been shown and described what are present considered the preferred embodiments of the present invention, it will be obvious to those skilled in the art that various changes and modifications may be made therein without departing from the scope of the invention as defined by the appended claims.

What is claimed is:

1. A wafer orienter for a wafer having a light-transmission characteristic including a pass band and a stop band, comprising:
   a mechanism for rotating the wafer; and
   a wafer orienter sensor comprising:
      a light source for emitting light;
      a light sensor for sensing the light emitted by said light source as an edge of the wafer is rotated between said light source and said sensor and for producing a sensor signal representative of the sensed light; and
      an optical filter positioned between said light source and said light sensor, said optical filter having a light-transmission characteristic wherein light in the pass band of the wafer is blocked.

2. A wafer orienter as defined in claim 1, wherein the wafer is a gallium arsenide wafer and wherein said optical filter blocks light at wavelengths greater than about 860 nanometers.

3. A wafer orienter as defined in claim 2, wherein said light source comprises an incandescent lamp which emits light that includes wavelengths greater than about 860 nanometers.

4. A wafer orienter as defined in claim 1, further comprising an amplifier for amplifying said sensor signal to compensate for light attenuation in said optical filter.

5. A wafer orienter as defined in claim 1, wherein said sensor signal is representative of a fiducial on the edge of the wafer.

6. A method for sensing orientation of a wafer having a light-transmission characteristic including a pass band and a stop band, comprising the steps of:
   rotating the wafer;
   directing light emitted by a light source toward an edge of the wafer as the wafer is rotated;
   sensing the light emitted by said light source with a light sensor as the edge of the wafer is rotated between said light source and said light sensor; and
   blocking light in the pass band of the wafer from reaching said light sensor.

7. A method as defined in claim 6, wherein the wafer comprises a gallium arsenide wafer and wherein the step of blocking light comprises blocking light at wavelengths greater than about 860 nanometers.

8. A method as defined in claim 7, wherein the step of directly light comprises directing light from an incandescent lamp which emits light that includes wavelengths greater than about 860 nanometers.

9. A method as defined in claim 6, further comprising the step of amplifying the sensor signal to compensate for light attenuation in the light blocking step.

10. A method as defined in claim 6, wherein the sensor signal is representative of a fiducial on the edge of the wafer.

11. A wafer orienter for a gallium arsenide wafer, comprising:
   a mechanism for rotating the wafer; and
   a wafer orientation sensor comprising:
      a light source for emitting light;
      a light sensor for sensing the light emitted by said light source as an edge of the wafer is rotated between said light source and said sensor and for producing a sensor signal representative of the sensed light; and
      an optical filter positioned between said light source and said light sensor, said optical filter having a light-transmission characteristic wherein light at wavelengths greater than about 860 nanometers is blocked.

12. A wafer orienter as defined in claim 11 wherein said light source comprises an incandescent lamp which emits light that includes wavelengths greater than about 860 nanometers.

13. A wafer orienter as defined in claim 11 wherein said light source emits light at wavelengths above and below 860 nanometers and wherein said optical filter transmits light at wavelengths less than about 860 nanometers.

14. A wafer orienter as defined in claim 11 wherein said sensor signal is representative of a fiducial on the edge of the wafer.

* * * * *